US011723232B2

(12) United States Patent
Wu et al.

(10) Patent No.: US 11,723,232 B2
(45) Date of Patent: Aug. 8, 2023

(54) ORGANIC LIGHT-EMITTING DISPLAY PANEL, PREPARATION METHOD THEREOF, DISPLAY APPARATUS AND ELECTRONIC DEVICE

(71) Applicants: Chongqing BOE Display Technology Co., Ltd., Chongqing (CN); BOE Technology Group Co., Ltd., Beijing (CN)

(72) Inventors: Xinwei Wu, Beijing (CN); Wei Zhang, Beijing (CN); Yanyan Xu, Beijing (CN); Cunzhi Li, Beijing (CN); Dawei Shi, Beijing (CN); Dongsheng Zhao, Beijing (CN); Jonguk Kwak, Beijing (CN)

(73) Assignees: Chongqing BOE Display Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 208 days.

(21) Appl. No.: 17/370,711

(22) Filed: Jul. 8, 2021

(65) Prior Publication Data
US 2022/0102437 A1    Mar. 31, 2022

(30) Foreign Application Priority Data

Sep. 29, 2020  (CN) .......................... 202011057649.9

(51) Int. Cl.
*H01L 21/00*  (2006.01)
*H10K 59/121*  (2023.01)
*H10K 59/65*  (2023.01)
*H10K 71/00*  (2023.01)
*H10K 59/12*  (2023.01)

(52) U.S. Cl.
CPC .......... *H10K 59/121* (2023.02); *H10K 59/65* (2023.02); *H10K 71/00* (2023.02); *H10K 59/1201* (2023.02)

(58) Field of Classification Search
CPC .......................... H10K 59/121; H10K 59/131
See application file for complete search history.

(56) References Cited

U.S. PATENT DOCUMENTS

| | | | | |
|---|---|---|---|---|
| 2019/0172880 | A1* | 6/2019 | Zhou ...................... | H10K 59/38 |
| 2022/0037426 | A1* | 2/2022 | Huang ................. | H10K 59/351 |
| 2022/0399414 | A1* | 12/2022 | Son ......................... | H10K 50/85 |
| 2023/0006095 | A1* | 1/2023 | Park ...................... | H01L 25/167 |

* cited by examiner

*Primary Examiner* — Douglas M Menz
(74) *Attorney, Agent, or Firm* — IPro, PLLC

(57) ABSTRACT

An organic light-emitting display panel is provided. The organic light-emitting display panel includes a substrate and a plurality of pixel units disposed on a side of the substrate, wherein the pixel unit includes an organic light-emitting diode (OLED); the substrate has a first pixel density area and a second pixel density area, and a density of pixel units in the first pixel density area is greater than that of pixel units in the second pixel density area; and in the second pixel density area, a light-emitting surface of the OLED protrudes along a light-emitting direction of the OLED.

20 Claims, 2 Drawing Sheets

ORGANIC LIGHT-EMITTING DISPLAY PANEL, PREPARATION METHOD THEREOF, DISPLAY APPARATUS AND ELECTRONIC DEVICE

CROSS-REFERENCE TO RELATED APPLICATION

This application is based on and claims priority to Chinese Patent Application No. 202011057649.9, filed on Sep. 29, 2020 and entitled "ORGANIC LIGHT-EMITTING DISPLAY PANEL, PREPARATION METHOD THEREOF, DISPLAY APPARATUS AND ELECTRONIC DEVICE", the disclosure of which is incorporated herein by reference in its entirety.

TECHNICAL FIELD

The present disclosure relates to the field of display, and in particular to an organic light-emitting display panel, a preparation method thereof, a display apparatus and an electronic device.

BACKGROUND

Currently, most manufacturers pursue a higher screen-to-body ratio for screens of electronic devices in order to bring customers a more brilliant visual impact. However, the camera module in the electronic device limits the development to a higher screen-to-body ratio of the screen. The electronic devices in which the camera module is placed in the screen with the normal display function (i.e., full-screen electronic devices) are attracting high attention from the whole industry.

SUMMARY

The present disclosure provides an organic light-emitting display panel, a preparation method thereof, a display apparatus and an electronic device. The technical solutions are as follows.

In an aspect of the present disclosure, an organic light-emitting display panel is provided. The organic light-emitting display panel includes a substrate and a plurality of pixel units disposed on a side of the substrate, wherein the pixel unit includes an organic light-emitting diode (OLED); the substrate has a first pixel density area and a second pixel density area, and a density of pixel units in the first pixel density area is greater than that of pixel units in the second pixel density area, and in the second pixel density area, a light-emitting surface of the OLED protrudes along a light-emitting direction of the OLED.

Optionally, the OLED includes a first electrode, a light-emitting layer and a second electrode which are sequentially laminated, and the first electrode, the light-emitting layer and the second electrode that are disposed in the second pixel density area all protrude along the light-emitting direction of the OLED.

Optionally, the light-emitting direction of the OLED is a direction from the substrate towards the OLED.

Optionally, the organic light-emitting display panel further includes an intermediate layer, and in the second pixel density area, the first electrode is disposed on a side of the intermediate layer away from the substrate.

Optionally, in the second pixel density area, a first protruding structure is provided on a surface of the intermediate layer away from the substrate, the first protruding structure protruding in the light-emitting direction of the OLED, and in the second pixel density area, an orthographic projection of the first electrode on the substrate is overlapped with an orthographic projection of the first protruding structure on the substrate.

Optionally, the intermediate layer is a planarization layer.

Optionally, the organic light-emitting display panel further includes an interlayer insulating layer, wherein the planarization layer is disposed on a side of the interlayer insulating layer away from the substrate.

Optionally, in the second pixel density area, a second protruding structure is provided on a surface of the interlayer insulating layer away from the substrate, the second protruding structure protruding in the light-emitting direction of the OLED, and the orthographic projection of the first protruding structure on the substrate is overlapped with an orthographic projection of the second protruding structure on the substrate.

Optionally, the intermediate layer is an interlayer insulating layer.

Optionally, the organic light-emitting display further includes a planarization layer, wherein the planarization layer is disposed on the side of the interlayer insulating layer away from the substrate, and an orthographic projection of the planarization layer on the substrate is within the first pixel density area.

Optionally, an orthographic projection of the interlayer insulating layer on the substrate is within the first pixel density area and the second pixel density area.

Optionally, the first electrode is an anode and the second electrode is a cathode.

Optionally, boundaries of sections of the protruding structures of the first electrode, the light-emitting layer and the second electrode in a first direction are all arc-shaped, and the first direction is perpendicular to a surface of the substrate for carrying the OLED.

Optionally, the organic light-emitting display panel further includes: a virtual pixel driving unit disposed in the first pixel density area and configured to drive the OLED in the second pixel density area to emit light.

In another aspect of the present disclosure, a method for preparing the organic light-emitting display panel described above is provided. The method includes: providing a substrate; forming a plurality of pixel units on the substrate, wherein the pixel unit includes an OLED, a first pixel density area and a second pixel density area are formed on the substrate, a density of pixel units in the first pixel density area is greater than that of pixel units in the second pixel density area, and a light-emitting surface of the OLED in the second pixel density area protrudes along a light-emitting direction of the OLED.

Optionally, prior to forming the plurality of pixel units on the substrate, the method further includes: sequentially forming an interlayer insulating layer and a planarization layer on the substrate, wherein in the second pixel density area, a first protruding structure is provided on the surface of the planarization layer away from the substrate and the first protruding structure protrudes along the light-emitting direction of the OLED; and forming the plurality of pixel units on the substrate includes: sequentially forming a first electrode, a light-emitting layer and a second electrode on the substrate on which the planarization layer is formed, wherein in the second pixel density area, the first electrode, the light-emitting layer and the second electrode protrude along the light-emitting direction of the OLED, and orthographic projections of the first electrode, the light-emitting layer and the second electrode on the substrate are overlapped with an orthographic projection of the first protruding structure on the substrate.

Optionally, prior to forming the plurality of pixel units on the substrate, the method further includes: sequentially forming an interlayer insulating layer and a planarization layer on the substrate, wherein in the second pixel density area, a first protruding structure is provided on the surface of the interlayer insulating layer away from the substrate, wherein the first protruding structure protrudes along the light-emitting direction of the OLED, and an orthographic projection of the planarization layer on the substrate is within the first pixel density area; and forming the plurality of pixel units on the substrate includes: sequentially forming a first electrode, a light-emitting layer and a second electrode on the substrate on which the planarization layer is formed, wherein in the second pixel density area, the first electrode, the light-emitting layer and the second electrode protrude along the light-emitting direction of the OLED, and orthographic projections of the first electrode, the light-emitting layer and the second electrode on the substrate are overlapped with an orthographic projection of the first protruding structure on the substrate.

Optionally, forming the interlayer insulating layer on the substrate includes: forming an interlayer insulating layer material on the substrate, and removing the interlayer insulating layer material of partial-thickness in a predetermined area in the second pixel density area, such that a portion of the interlayer insulating layer which is disposed in an area other than the predetermined area in the second pixel density area forms the first protruding structure.

In yet another aspect of the present disclosure, a display apparatus is provided. The display apparatus includes the organic light-emitting display panel provided in the present disclosure.

In still another aspect of the present disclosure, an electronic device is provided. The electronic device includes a camera module and the display apparatus provided in the present disclosure. An orthographic projection of a camera of the camera module on the display apparatus is within the second pixel density area of the display apparatus.

Some additional aspects and advantages of the present disclosure are set forth in the following descriptions, and others aspects and advantages will be apparent from the following descriptions, or may be learned by practice of the present disclosure.

BRIEF DESCRIPTION OF THE DRAWINGS

The above and/or additional aspects and advantages of the present disclosure will become apparent and easy to understand from the descriptions of the embodiments with reference to the following drawings.

DETAILED DESCRIPTION

Figure 1:
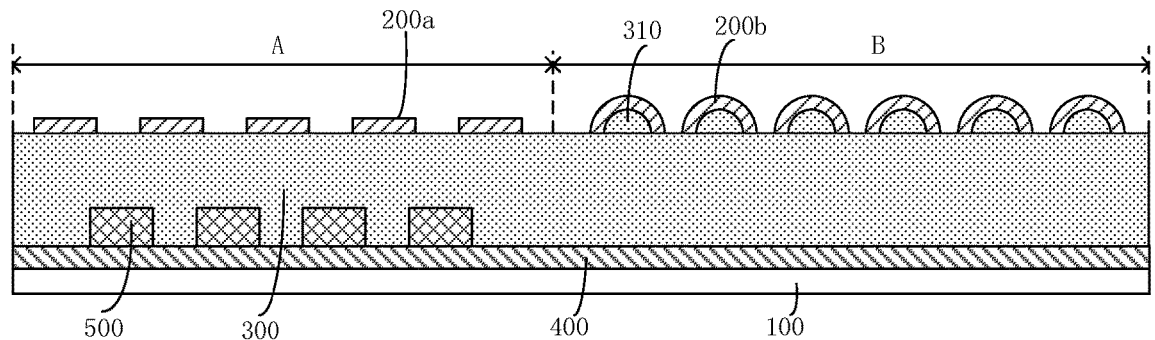
FIG. 1 shows a sectional structural schematic diagram of an organic light-emitting display panel according to an embodiment of the present disclosure.

The embodiments of the present disclosure are described in detail below. Examples of the embodiments are shown in the accompanying drawings, in which the same or similar reference numerals denote the same or similar elements or elements with the same or similar functions throughout. The embodiments described below with reference to the drawings are exemplary, and are merely used to illustrate the present disclosure, and should not be construed as limitations to the present disclosure.

Currently, a full-screen electronic device is mainly implemented by reducing the pixel density in the area where the camera module is disposed to ensure favorable transmittance in the area, such that the camera module can achieve the purpose of taking pictures and videos. However, if the pixel density in the area where the camera module is disposed differs greatly from the pixel density in other areas, the quality of images displayed by the electronic device will be adversely affected.

Therefore, the structural design of the current electronic devices still needs to be improved.

The present disclosure provides an organic light-emitting display panel. According to an embodiment of the present disclosure, referring to FIG. 1, the organic light-emitting display panel includes a substrate 100 and a plurality of pixel units disposed on a side of the substrate 100.

The substrate 100 has a first pixel density area A and a second pixel density area B, and the density of the pixel units in the first pixel density area A is greater than that of the pixel units in the second pixel density area B.

The pixel unit includes an OLED. In the second pixel density area B, the light-emitting surface of the OLED protrudes along the light-emitting direction of the OLED (not shown in the figure).

In the organic light-emitting display panel provided by the embodiment of the present disclosure, since the light-emitting surface of the OLED protrudes along the light-emitting direction of the OLED, compared with an organic light-emitting display panel in the related art, the light-emitting area of the OLED provided by the embodiment of the present disclosure increases when the area of the orthographic projection of the OLED in the related art on the substrate 100 is the same as the area of the orthographic projection of the OLED provided by the embodiment of the present disclosure on the substrate 100, and the pixel density of the second pixel density area B in the related art is the same as the pixel density of the second pixel density area B in the embodiment of the present disclosure. Therefore, the overall light-emitting area of the second pixel density area B in the organic light-emitting display panel in the embodiment of the present disclosure can be increased on the premise that the light transmittance of the organic light-emitting display panel is not significantly reduced, and thus the quality of images displayed by the organic light-emitting display panel is improved.

Alternatively, on the premise that the pixel density of the organic light-emitting display panel provided by the embodiment of the present disclosure is not significantly reduced compared with the pixel density of the organic light-emitting display panel in the related art, and the organic light-emitting display panel provided by the embodiment of the present disclosure and the organic light-emitting display panel in the related art have approximately the same light-emitting area, the OLED in the embodiment of the present disclosure can be made smaller, which can improve the light transmittance of the second pixel density area B, thereby guaranteeing the quality of images displayed by the organic light-emitting display panel. In addition, the organic light-emitting display panel provided by the embodiment of the present disclosure is simple in structure and easy to implement.

Alternatively, on the premise that the light-emitting area of the organic light-emitting display panel provided by the embodiment of the present disclosure is not significantly reduced compared to the light-emitting area of the organic light-emitting display panel in the related art, and the organic light-emitting display panel provided by the embodiment of the present disclosure and the organic light-emitting display panel in the related art have approximately the same light transmittance, more OLEDs can be disposed in the second pixel density area B in the present disclosure, which can improve the pixel density in the second pixel density area B, reduce the difference of the pixel density between the first pixel density area A and the second pixel density area B, thereby guaranteeing the quality of images displayed by the organic light-emitting display panel.

According to the embodiment of the present disclosure, assuming that the area of the second pixel density area B is S, the transmittance of the second pixel density area B is x, and the number of pixels in the second pixel density area B is n, then the light-emitting area in the second pixel density area B is $S \times (1-x)$. Then, in the organic light-emitting display panel provided by the embodiment of the present disclosure, the light-emitting area in the second pixel density area B should be k times of $S \times (1-x)$, in which k varies with the shape of the protruding structure on the light-emitting surface of the OLED. The value of k may be the ratio of the surface area of the protruding structure of the light-emitting surface of the OLED to the area of the orthographic projection of the protruding structure on the substrate 100 in the embodiment of the present disclosure. It can be understood that since the protruding structure protrudes along the light-emitting direction of the OLED, the value of k should be greater than 1. Therefore, when the area of the orthographic projection of the OLED in the related art on the substrate 100 is the same as the area of the orthographic projection of the OLED provided by the embodiment of the present disclosure on the substrate 100, and the pixel density of the second pixel density area B in the related art is the same as the pixel density of the second pixel density area B in the embodiment of the present disclosure, the overall light-emitting area of the second pixel density area B in the organic light-emitting display panel is increased. Similarly, the light transmittance or the pixel density of the second pixel density area B can be improved.

In a possible implementation, the OLED includes a first electrode, a light-emitting layer and a second electrode which are sequentially laminated, and the first electrode, the light-emitting layer and the second electrode that are disposed in the second pixel density area B may all protrude along the light-emitting direction of the OLED. For example, as shown in FIG. 1, the OLED includes an anode 200a, an anode 200b, a light-emitting layer (not shown in the figure), and a cathode (not shown in the figure) which are sequentially laminated, and the anode 200a, anode 200b, the light-emitting layer and the cathode may all protrude along the light-emitting direction of the OLED. That is, in FIG. 1, the first electrode is an anode, the second electrode is a cathode, and the light-emitting direction of the OLED is a direction from the substrate 100 towards the OLED.

In addition, the organic light-emitting display panel provided by the embodiment of the present disclosure may be a top-emitting display panel or a bottom-emitting display panel. When the organic light-emitting display panel is a top-emitting display panel, the light-emitting direction of the OLED is in the direction from the substrate 100 towards the OLED. When the organic light-emitting display panel is a bottom-emitting display panel, the light-emitting direction of the OLED is a direction from the OLED points towards the substrate 100.

In a possible implementation, when the organic light-emitting display panel is a top-emitting display panel, the anode 200b of the OLED disposed in the second pixel density area B is of a protruding structure protruding away from the substrate 100, and the structures of the light-emitting layer and the cathode match that of the anode 200b. In this way, the anode 200b, the light-emitting layer and the cathode may all protrude along the direction from the substrate 100 towards the OLED. Similarly, when the organic light-emitting display panel is a bottom-emitting display panel, the anode 200b of the OLED disposed in the second pixel density area B is of a protruding structure protruding towards the substrate 100, and the structures of the light-emitting layer and the cathode match that of the anode 200b.

Optionally, the organic light-emitting display panel further includes an intermediate layer. In this case, in the second pixel density area B, the first electrode may be disposed on the side of the intermediate layer away from the substrate 100. For example, the first electrode is disposed on the surface of the intermediate layer away from the substrate 100.

Moreover, in the second pixel density area B, a first protruding structure is provided on the surface of the intermediate layer away from the substrate 100. The first protruding structure protrudes along the light-emitting direction of the OLED, and in the second pixel density area B, the orthographic projection of the first electrode on the substrate 100 is overlapped with the orthographic projection of the first protruding structure on the substrate 100. Overlapping between the orthographic projection of the first electrode on the substrate 100 and the orthographic projection of the first protruding structure on the substrate 100 refers to that the orthographic projection of the first electrode on the substrate 100 at least partially overlaps the orthographic projection of the first protruding structure on the substrate 100. In this way, since the first protruding structure is provided on the surface of the intermediate layer away from the substrate 100, and the first electrode is formed on the surface of the intermediate layer away from the substrate 100, a structure protruding along the light-emitting direction of the OLED may also be formed on the surface of the first electrode away from the substrate 100. Similarly, in the embodiments of the present disclosure, overlapping between the two orthographic projections refers to that the two orthographic projections are at least partially overlapped.

Optionally, the intermediate layer may be a planarization layer 300. In a possible implementation, the organic light-emitting display panel further includes an interlayer insulating layer 400. The planarization layer 300 is disposed on the side of the interlayer insulating layer 400 away from the substrate 100, and the interlayer insulating layer 400 is configured to prevent circuits disposed on two sides of the interlayer insulating layer 400 from short circuit. In this case, the first protruding structure 310 on the surface of the planarization layer 300 may be formed in at least the following two implementations.

In a first possible implementation, the side of the interlayer insulating layer 400 away from the substrate 100 is not provided with a structure that may form the first protruding structure 310, and in the second pixel density area B, the first protruding structure 310 is provided on the surface of the planarization layer 300 away from the substrate 100. For example, referring to FIG. 1, the anode 200b is formed on the side of the planarization layer 300 away from the substrate 100; in the second pixel density area B, the first protruding structure 310 is provided on the surface of the planarization layer 300 away from the substrate 100; and the anode 200b formed on the first protruding structure 310 is of a protruding structure protruding away from the substrate 100. By disposing the first protruding structure 310 on the planarization layer 300, the anode 200b may be effectively of a protruding structure protruding away from the substrate 100. Therefore, the requirements of the manufacturing process for forming the anode 200b are reduced, which makes it easy to manufacture the anode 200b.

Figure 2:
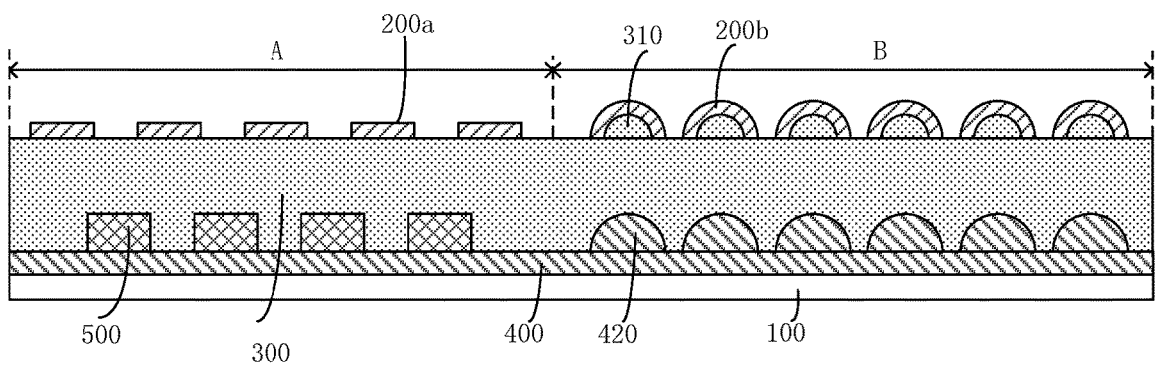
FIG. 2 shows a sectional structural schematic diagram of another organic light-emitting display panel according to an embodiment of the present disclosure.

In a second possible implementation, a protruding structure protruding along the light-emitting direction of the OLED is provided on the side of the interlayer insulating layer 400 away from the substrate 100. For example, as shown in FIG. 2, in the second pixel density area B, a second protruding structure 420 is provided on the surface of the interlayer insulating layer 400 away from the substrate 100, and the second protruding structure 420 protrudes along the light-emitting direction of the OLED. The orthographic projection of the first protruding structure 310 on the substrate 100 overlaps the orthographic projection of the second protruding structure 420 on the substrate 100. Due to the impact from the second protruding structure 420, when the planarization layer is formed on the interlayer insulating layer 400, the material for forming the planarization layer may form the first protruding structure 310 above the second protruding structure 420.

Alternatively, the intermediate layer is an interlayer insulating layer 400, and the orthographic projection of the interlayer insulating layer 400 on the substrate 100 is within the first pixel density area A and the second pixel density area B. In some embodiments, the organic light-emitting display panel further includes a planarization layer 300. The planarization layer 300 is disposed on the side of the interlayer insulating layer 400 away from the substrate 100, and the orthographic projection of the planarization layer 300 on the substrate 100 is within the first pixel density area A. It can be known that the planarization layer 300 is not disposed in the second pixel density area B. In this case, in the second pixel density area B, the first electrode may be directly disposed on the side of the interlayer insulating layer 400 away from the substrate 100.

Figure 3:
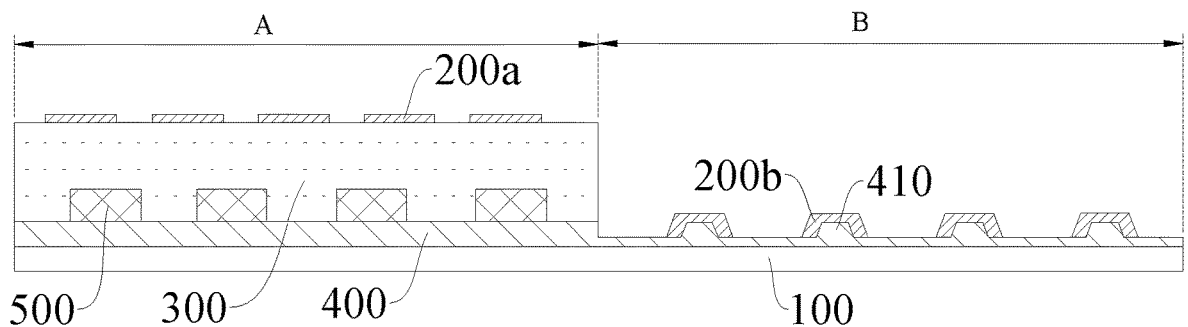
FIG. 3 shows a sectional structural schematic diagram of yet another organic light-emitting display panel according to an embodiment of the present disclosure.

For example, referring to FIG. 3, the organic light-emitting display panel further includes an interlayer insulating layer 400, which extends from the first pixel density area A to the second pixel density area B. A planarization layer 300 is disposed on the side of the interlayer insulating layer 400 away from the substrate 100. The orthographic projection of the planarization layer 300 on the substrate 100 is within the first pixel density area A, and in the second pixel density area B, the first protruding structure 410 is provided on the surface of the interlayer insulating layer 400 away from the substrate 100.

In the embodiments of the present disclosure, the shape of the protruding structure is not particularly limited, and may be set based on application requirements. For example, in the embodiments of the present disclosure, referring to FIGS. 1, 2 and 3, boundaries of sections of the protruding structures of the first electrode, the light-emitting layer and the second electrode in a first direction may be all arc-shaped (referring to FIGS. 1 to 2 for the schematic structural diagrams), or take the shape of a trapezoid without the base (referring to FIG. 3 for the schematic structural diagram) or may be in other shapes (for example, a sawtooth or a rectangle without one long side). Here, the first direction is perpendicular to the surface of the substrate 100 for carrying the OLED. Therefore, owing to the shapes of the protruding structures, the first electrode, the light-emitting layer and the second electrode may be provided with protruding structures of different shapes, and thus different values of k may be obtained.

In the embodiments of the present disclosure, referring to FIGS. 1, 2 and 3, the organic light-emitting display panel may further include a virtual pixel driving unit 500. The virtual pixel driving unit 500 may be disposed in the first pixel density area A and is configured to drive the OLED in the second pixel density area B to emit light. In the related art, the pixel driving unit configured to drive the OLED to emit light is generally arranged adjacent to the OLED. However, in the embodiments of the present disclosure, by disposing the pixel driving unit, which is configured to drive the OLED in the second pixel density area B, in the first pixel density area A, the transmittance of the second pixel density area B can be increased, which help install devices that work under light, e.g., a camera, in the second pixel density area B. and guarantees the working performance of the devices that work under light, e.g., the camera. In addition, the virtual pixel driving unit 500 is referred to as the virtual pixel driving unit 500 because it is configured to drive the OLED in the second pixel density area B rather than the OLEDs in the area where the virtual pixel driving unit 500 is disposed.

The virtual pixel driving unit 500 includes a plurality of thin film transistors and at least one capacitor. Other specific structures of the virtual pixel driving unit 500 may be the same as that of the virtual pixel driving unit 500 in the related art, and thus are not repeated herein. Thus, the first pixel density area A of the organic light-emitting display panel may have an excellent display effect, and the organic light-emitting display panel may have a better overall display effect.

It can be understood that the organic light-emitting display panel may further include other necessary structures and components, e.g., a packaging structure, which may be supplemented and designed by those skilled in the art according to the specific types and usage requirements of the organic light-emitting display panel, and details are not repeated herein.

Figure 4:
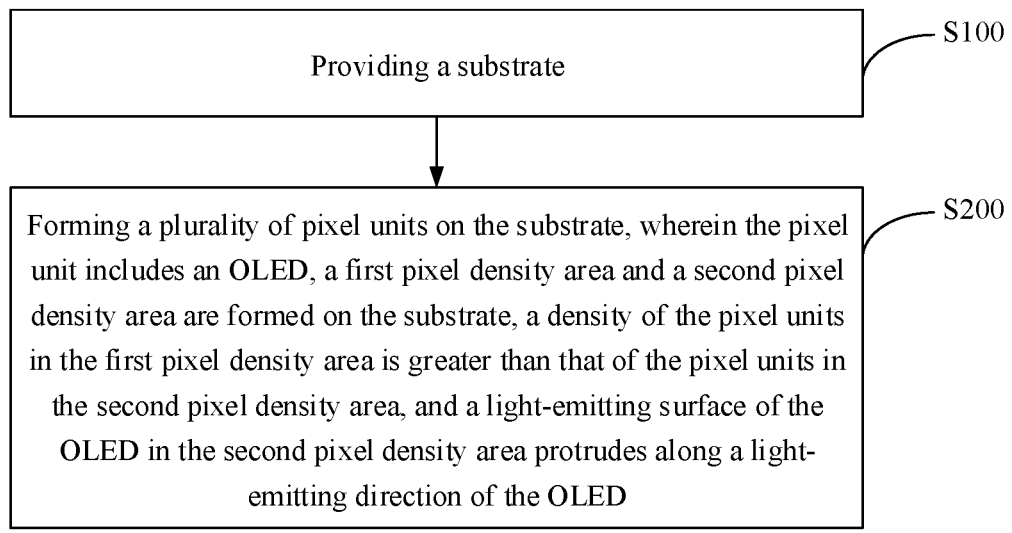
FIG. 4 shows a flow chart of a method for preparing an organic light-emitting display panel according to an embodiment of the present disclosure.

The present disclosure provides a method for preparing an organic light-emitting display panel. According to the embodiment of the present disclosure, referring to FIG. 4, the method may include the following steps.

In S100, a substrate is provided.

In S200, a plurality of pixel units are formed on the substrate. The pixel unit includes an OLED. A first pixel density area and a second pixel density area are formed on the substrate. The density of the pixel units in the first pixel density area is greater than that of the pixel units in the second pixel density area. The light-emitting surface of the OLED disposed in the second pixel density area protrudes along the light-emitting direction of the OLED.

According to the foregoing embodiments of the organic light-emitting display panel, it can be known that the OLED includes a first electrode, a light-emitting layer and a second electrode which are sequentially laminated, and the first electrode, the light-emitting layer and the second electrode that are disposed in the second pixel density area all protrude along the light-emitting direction of the OLED. Therefore, the process of forming the OLED in S200 may include: sequentially forming the first electrode, the light-emitting layer and the second electrode that protrude along the light-emitting direction of the OLED.

The organic light-emitting display panel provided by the embodiments of the present disclosure may be a top-emitting display panel or a bottom-emitting display panel. When the organic light-emitting display panel is a top-emitting display panel, the light-emitting direction of the OLED is a direction from the substrate towards the OLED. When the organic light-emitting display panel is a bottom-emitting display panel, the light-emitting direction of the OLED is a direction from the OLED points towards the substrate.

Additionally, the organic light-emitting display panel may include an interlayer insulating layer, a planarization layer, a first electrode layer, a light-emitting layer and a second electrode layer sequentially laminated on the substrate. The first electrode layer includes a plurality of first electrodes, and the first electrodes disposed in the second pixel density area protrude along the light-emitting direction of the OLED. The second electrode layer includes a plurality of second electrodes, and the second electrodes disposed in the second pixel density area protrude along the light-emitting direction of the OLED.

According to the foregoing embodiments of the organic light-emitting display panel, it can be known that the interlayer insulating layer and the planarization layer are arranged in at least the following three ways.

In a first arrangement way, a second protruding structure is provided on the surface of the interlayer insulating layer away from the substrate, and a first protruding structure is provided on the surface of the planarization layer away from the substrate. Both the first protruding structure and the second protruding structure protrude along the light-emitting direction of the OLED. In the second pixel density area, the orthographic projection of the first electrode on the substrate overlaps the orthographic projection of the first protruding structure on the substrate, and the orthographic projection of the first protruding structure on the substrate overlaps the orthographic projection of the second protruding structure on the substrate.

Corresponding to the first arrangement way, prior to forming the plurality of pixel units on the substrate, the method further includes: sequentially forming an interlayer insulating layer and a planarization layer on the substrate. In the second pixel density area, a first protruding structure is provided on the surface of the planarization layer away from the substrate, and the first protruding structure protrudes along the light-emitting direction of the OLED.

Correspondingly, forming the plurality of pixel units on the substrate includes: sequentially forming the first electrode, the light-emitting layer and the second electrode on the substrate on which the planarization layer is formed. In the second pixel density area, the first electrode, the light-emitting layer and the second electrode are enabled to protrude along the light-emitting direction of the OLED, and the orthographic projections of the first electrode, the light-emitting layer and the second electrode on the substrate overlap the orthographic projection of the first protruding structure on the substrate.

In a second arrangement way, the planarization layer is disposed on the surface of the interlayer insulating layer away from the substrate, and the surface of the interlayer insulating layer away from the substrate is not provided with a second protruding structure. A first protruding structure is provided on the surface of the planarization layer away from the substrate and the first protruding structure protrudes along the light-emitting direction of the OLED. In the second pixel density area, the orthographic projection of the first electrode on the substrate overlaps the orthographic projection of the first protruding structure on the substrate.

Corresponding to the second arrangement way, before the plurality of pixel units is formed on the substrate, the interlayer insulating layer and the planarization layer need to be formed sequentially on the substrate. However, during formation of the interlayer insulating layer, a second protruding structure does not to be formed on the surface of the interlayer insulating layer away from the substrate. The implementation of forming the planarization layer is the same as the implementation corresponding to the first arrangement way, and the implementation of forming the plurality of pixel units on the surface of the planarization layer away from the substrate is also the same as the implementation corresponding to the first arrangement way.

In a third arrangement way, the planarization layer is disposed on the surface of the interlayer insulating layer away from the substrate. The orthographic projection of the planarization layer on the substrate is within the first pixel density area. A first protruding structure is provided on the surface of the interlayer insulating layer away from the substrate and the first protruding structure protrudes along the light-emitting direction of the OLED. Id in the second pixel density area, the orthographic projection of the first electrode on the substrate overlaps the orthographic projection of the first protruding structure on the substrate.

Corresponding to the third arrangement way, prior to forming the plurality of pixel units on the substrate, the method further includes: sequentially forming an interlayer insulating layer and a planarization layer on the substrate. In the second pixel density area, a first protruding structure is provided on the surface of the interlayer insulating layer away from the substrate and the first protruding structure protrudes along the light-emitting direction of the OLED. The orthographic projection of the planarization layer on the substrate is within the first pixel density area.

Correspondingly, forming the plurality of pixel units on the substrate includes: sequentially forming the first electrode, the light-emitting layer and the second electrode on the substrate on which the planarization layer is formed, and in the second pixel density area, the first electrode, the light-emitting layer and the second electrode are enabled to protrude along the light-emitting direction of the OLED, and the orthographic projections of the first electrode, the light-emitting layer and the second electrode on the substrate overlap the orthographic projection of the first protruding structure on the substrate.

According to the embodiments of the present disclosure, for the specific process conditions, steps and parameters for forming the interlayer insulating layer, the planarization layer, the first electrode layer, the light-emitting layer, and the second electrode layer on the substrate, and for forming the protruding structures on the relevant film layers, the specific process conditions, steps and parameters of the conventional process in the related art may be adopted, and details are not repeated herein. For example, the implementation of forming the interlayer insulating layer on the substrate may include: forming an interlayer insulating layer material on the substrate, and removing the interlayer insulating layer material of partial-thickness in a predetermined area in the second pixel density area, such that a portion of the interlayer insulating layer which is disposed in an area other than the predetermined area in the second pixel density area forms the first protruding structure.

Figure 5:
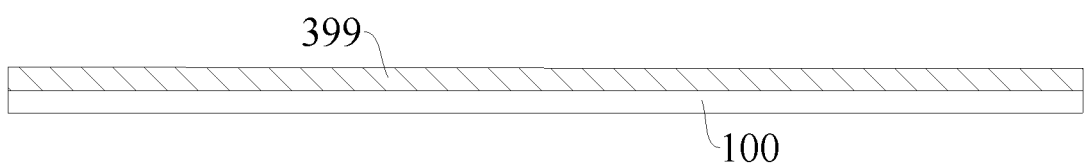
FIG. 5 shows a schematic diagram of a substrate on which an interlayer insulating layer material is formed according to an embodiment of the present disclosure.
Figure 6:
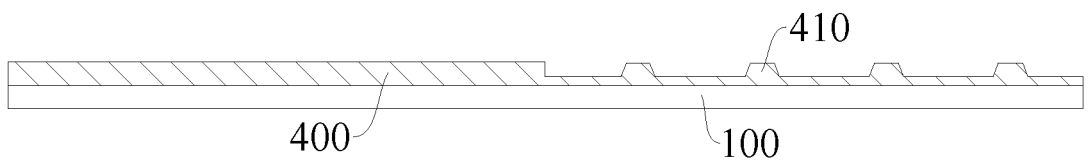
FIG. 6 shows a schematic diagram of a substrate on which an interlayer insulating layer is formed according to an embodiment of the present disclosure.

For example, in the embodiments of the present disclosure, the organic light-emitting display panel may include a display area and a bending area (not shown in the figure). Correspondingly, the implementation of forming the interlayer insulating layer may include: forming an interlayer insulating layer material 399 (referring to FIG. 5 for the schematic structural diagram) on the substrate; removing part of the interlayer insulating layer material 399 in the bending area by a patterning process to form a groove (not shown in the figure); and simultaneously, removing part of the interlayer insulating layer material 399 in a predetermined area in the second pixel density area, to form a first protruding structure 410 (referring to FIG. 6 for a schematic structural diagram) at the position of the first electrode (for example, the anode) to be formed, in the second pixel density area. Accordingly, corresponding to the third arrangement way described above, after the first protruding structure 410 is formed on the interlayer insulating layer, an entire layer of planarization layer material may be deposited on the surface of the interlayer insulating layer away from the substrate, and an etching treatment is performed on the planarization layer material with a mask, to form a planarization layer in the first pixel density area. After that, an entire layer of first electrode material is deposited on the substrate on which the planarization layer is formed to obtain the first electrode material layer, and an etching treatment is performed on first electrode material layer with a mask, to form the protruding structure of the first electrode. Then, a pixel defining layer is formed, by means of material deposition, mask processing, etching treatment, and the like, on the substrate on which the first electrode is formed. Afterwards, a light-emitting layer is formed, by means of ink-jet printing and the like, in the area defined by the pixel defining layer. Subsequently, a second electrode is formed, by means of material deposition, mask processing, etching treatment, and the like, on the substrate on which the light-emitting layer is formed, so as to acquire the organic light-emitting display panel as described in the third arrangement way. The etching treatment may be wet etching, and the specific process parameters of deposition, etching treatment and the like may all be the same as specific process parameters of deposition, etching treatment and the like in the related art, and thus details are not repeated herein. Therefore, the method is simple and convenient, easy to implement and easy for industrial production, and the organic light-emitting display panel can be prepared effectively.

It can be known from the above that the manufacturing methods of the above film layers are simple and convenient, easy to implement and easy for industrial production, and the organic light-emitting display panel provided by the embodiments of the present disclosure can be effectively prepared.

According to the embodiments of the present disclosure, it can be understood that the method may also include other necessary steps, such as steps of forming other components in the OLED (e.g., the light-emitting layer, the cathode, and the like), and steps of forming the packaging structure, which may be supplemented and designed by those skilled in the art according to the specific types and usage requirements of the organic light-emitting display panel, and details are not repeated herein.

The present disclosure further provides a display apparatus. According to an embodiment of the present disclosure, the display apparatus includes the organic light-emitting display panel provided by the embodiments of the present disclosure. The display apparatus is simple in structure and easy to implement. As the display apparatus includes the organic light-emitting display panel provided by the embodiments of the present disclosure, the display apparatus has all the characteristics and advantages of the organic light-emitting display panel described above, and details are not repeated herein.

According to an embodiment of the present disclosure, in addition to the display panel, the display apparatus may further include other necessary structures and components, which may be supplemented and designed by those skilled in the art according to the specific types and usage requirements of the display apparatus, and details are not repeated herein.

The present disclosure further provides an electronic device. According to an embodiment of the present disclosure, the electronic device includes a camera module and the display apparatus provided by the embodiments of the present disclosure. The camera module may be disposed at the non-light-emitting side of the display apparatus, and the orthographic projection of the camera of the camera module on the display apparatus is within the second pixel density area of the display apparatus. The electronic device includes the display apparatus provided by the embodiments of the present disclosure, and the display apparatus includes the organic light-emitting display panel provided by the embodiments of the present disclosure. Therefore, the electronic device has all the characteristics and advantages of the organic light-emitting display panel described above, and details are not repeated herein.

According to the embodiments of the present disclosure, it can be understood that, in addition to the structures described above, the electronic device may further include other structures and components of a conventional electronic device, and details are not repeated herein.

According to the embodiments of the present disclosure, it can be understood that the electronic device may include, but is not limited to, a mobile phone, a tablet computer, a game console, a smart watch, or the like, which is repeated herein. Therefore, the electronic device has a wide range of applications.

In the descriptions of the present disclosure, orientations or positional relationships indicated by the terms "on", "below", and the like are orientations or positional relationships shown on the basis of the drawings, and are merely for the convenience of describing the present disclosure, instead of limiting the present disclosure to be structured and operated in a specific direction, and therefore should not be understood as limitations to the present disclosure.

In the descriptions of the present description, the descriptions with reference to terms such as "an embodiment" and "another embodiment" is intended to mean that the features, structures, materials or characteristics described in combination with the embodiment are included in at least one embodiment of the present disclosure. In the present description, the schematic descriptions of the above terms do not necessarily refer to the same embodiment or example. Furthermore, the described features, structures, materials or characteristics can be combined in a proper manner in any one or more embodiments or examples. In addition, in the condition of no contradiction with each other, various embodiments or examples and features in various embodiments or examples described in the present description may be integrated and combined by those skilled in the art. In addition, it should be noted that in the present description, the terms "first" and "second" are used for descriptive purposes only, and are not to be construed as indicating or implying any relative importance or implicitly indicating the number of technical features.

Although the embodiments of the present disclosure have been shown and described above, it can be understood that the above embodiments are exemplary only and shall not be construed as limitations to the present disclosure. Those of ordinary skill in the art can make changes, amendments, substitutions and modifications to the above-mentioned embodiments within the scope of the present disclosure.

What is claimed is:

1. An organic light-emitting display panel, comprising a substrate and a plurality of pixel units on a side of the substrate, the pixel unit comprising an organic light-emitting diode (OLED),
   wherein the substrate has a first pixel density area and a second pixel density area, wherein a density of pixel units in the first pixel density area is greater than a density of pixel units in the second pixel density area; and in the second pixel density area, a light-emitting surface of the OLED protrudes along a light-emitting direction of the OLED.

2. The organic light-emitting display panel according to claim 1, wherein the OLED comprises a first electrode, a light-emitting layer and a second electrode which are sequentially laminated, and the first electrode, the light-emitting layer and the second electrode that are disposed in the second pixel density area all protrude along the light-emitting direction of the OLED.

3. The organic light-emitting display panel according to claim 2, wherein the light-emitting direction of the OLED is a direction from the substrate towards the OLED.

4. The organic light-emitting display panel according to claim 2, further comprising an intermediate layer, wherein in the second pixel density area, the first electrode is disposed on a side of the intermediate layer away from the substrate.

5. The organic light-emitting display panel according to claim 4, wherein in the second pixel density area, a first protruding structure is provided on a surface of the intermediate layer away from the substrate, wherein the first protruding structure protrudes along the light-emitting direction of the OLED, and in the second pixel density area, an orthographic projection of the first electrode on the substrate is overlapped with an orthographic projection of the first protruding structure on the substrate.

6. The organic light-emitting display panel according to claim 4, wherein the intermediate layer is a planarization layer.

7. The organic light-emitting display panel according to claim 6, further comprising an interlayer insulating layer, wherein the planarization layer is disposed on a side of the interlayer insulating layer away from the substrate.

8. The organic light-emitting display panel according to claim 7, wherein in the second pixel density area, a second protruding structure is provided on a surface of the interlayer insulating layer away from the substrate, wherein the second protruding structure protrudes along the light-emitting direction of the OLED, and an orthographic projection of a first protruding structure on the substrate is overlapped with an orthographic projection of the second protruding structure on the substrate.

9. The organic light-emitting display panel according to claim 4, wherein the intermediate layer is an interlayer insulating layer.

10. The organic light-emitting display panel according to claim 9, further comprising a planarization layer, wherein the planarization layer is disposed on a side of the interlayer insulating layer away from the substrate, and an orthographic projection of the planarization layer on the substrate is within the first pixel density area.

11. The organic light-emitting display panel according to claim 9, wherein an orthographic projection of the interlayer insulating layer on the substrate is within the first pixel density area and the second pixel density area.

12. The organic light-emitting display panel according to claim 2, wherein the first electrode is an anode and the second electrode is a cathode.

13. The organic light-emitting display panel according to claim 2, wherein boundaries of sections of protruding structures of the first electrode, the light-emitting layer and the second electrode in a first direction are arc-shaped, the first direction being perpendicular to a surface of the substrate for carrying the OLED.

14. The organic light-emitting display panel according to claim 1, further comprising:
   a virtual pixel driving unit, disposed in the first pixel density area and configured to drive the OLED in the second pixel density area to emit light.

15. A method for preparing an organic light-emitting display panel, comprising:
   providing a substrate;
   forming a plurality of pixel units on the substrate, the pixel unit comprising an organic light-emitting diode (OLED), wherein a first pixel density area and a second pixel density area are formed on the substrate, a density of pixel units in the first pixel density area is greater than a density of pixel units in the second pixel density area, and a light-emitting surface of the OLED in the second pixel density area protrudes along a light-emitting direction of the OLED.

16. The method according to claim 15, wherein prior to forming the plurality of pixel units on the substrate, the method further comprises:
   sequentially forming an interlayer insulating layer and a planarization layer on the substrate, wherein in the second pixel density area, a first protruding structure is provided on a surface of the planarization layer away from the substrate, the first protruding structure protruding along the light-emitting direction of the OLED; and
   forming the plurality of pixel units on the substrate comprises:
     sequentially forming a first electrode, a light-emitting layer and a second electrode on the substrate on which the planarization layer is formed, wherein in the second pixel density area, the first electrode, the light-emitting layer and the second electrode protrude along the light-emitting direction of the OLED, and orthographic projections of the first electrode, the light-emitting layer and the second electrode on the substrate are overlapped with an orthographic projection of the first protruding structure on the substrate.

17. The method according to claim 15, wherein prior to forming the plurality of pixel units on the substrate, the method further comprises:
- sequentially forming an interlayer insulating layer and a planarization layer on the substrate, wherein in the second pixel density area, a first protruding structure is provided on a surface of the interlayer insulating layer away from the substrate, the first protruding structure protruding along the light-emitting direction of the OLED, and an orthographic projection of the planarization layer on the substrate is within the first pixel density area; and
- forming the plurality of pixel units on the substrate comprises:
  - sequentially forming a first electrode, a light-emitting layer and a second electrode on the substrate on which the planarization layer is formed, wherein in the second pixel density area, the first electrode, the light-emitting layer and the second electrode protrude along the light-emitting direction of the OLED, and orthographic projections of the first electrode, the light-emitting layer and the second electrode on the substrate are overlapped with an orthographic projection of the first protruding structure on the substrate.

18. The method according to claim 17, wherein forming the interlayer insulating layer on the substrate comprises: forming an interlayer insulating layer material on the substrate, and removing the interlayer insulating layer material of partial-thickness in a predetermined area in the second pixel density area, such that a portion of the interlayer insulating layer which is disposed in an area other than the predetermined area in the second pixel density area forms the first protruding structure.

19. A display apparatus, comprising an organic light-emitting display panel, wherein the organic light-emitting display panel comprises a substrate and a plurality of pixel units disposed on a side of the substrate, the pixel unit comprising an organic light-emitting diode (OLED),
- wherein the substrate has a first pixel density area and a second pixel density area, wherein a density of pixel units in the first pixel density area is greater than a density of pixel units in the second pixel density area; and in the second pixel density area, a light-emitting surface of the OLED protrudes along a light-emitting direction of the OLED.

20. An electronic device, comprising a camera module and the display apparatus as defined in claim 19, wherein an orthographic projection of a camera of the camera module on the display apparatus is within a second pixel density area of the display apparatus.

* * * * *